United States Patent
Boer et al.

(10) Patent No.: US 7,099,157 B2
(45) Date of Patent: Aug. 29, 2006

(54) RETAINING AND HEAT DISSIPATING STRUCTURE FOR ELECTRONIC EQUIPMENT

(75) Inventors: Fabrizio Boer, Rivoli (IT); Mario Biserni, Milan (IT)

(73) Assignees: Negesat di Boer Fabrizio & C. S.N.C., (IT); Laben S.P.A., (IT)

(*) Notice: Subject to any disclaimer, the term of this patent is extended or adjusted under 35 U.S.C. 154(b) by 0 days.

(21) Appl. No.: 10/512,854

(22) PCT Filed: May 7, 2003

(86) PCT No.: PCT/IB03/01873

§ 371 (c)(1),
(2), (4) Date: Jul. 25, 2005

(87) PCT Pub. No.: WO03/098987

PCT Pub. Date: Nov. 27, 2003

(65) Prior Publication Data

US 2006/0133045 A1    Jun. 22, 2006

(30) Foreign Application Priority Data

May 16, 2002    (IT) ................. TO2002A0416

(51) Int. Cl.
*H05K 7/20* (2006.01)

(52) U.S. Cl. ............... 361/721; 361/704; 165/80.3; 165/185

(58) Field of Classification Search ............... 361/704, 361/719, 721; 165/80.3, 185; 174/52.2
See application file for complete search history.

(56) References Cited

U.S. PATENT DOCUMENTS

| | | | |
|---|---|---|---|
| 3,888,691 A | 6/1975 | Villani et al. | |
| 5,060,114 A | 10/1991 | Feinberg et al. | |
| 5,307,508 A * | 4/1994 | Rollins et al. | 340/7.63 |
| 5,420,085 A | 5/1995 | Newkirk et al. | |
| 5,756,934 A * | 5/1998 | Purdom | 174/52.1 |
| 6,143,978 A * | 11/2000 | Ren et al. | 174/17 SF |
| 6,215,658 B1 * | 4/2001 | Bodini | 361/695 |
| 6,287,511 B1 | 9/2001 | Merrill et al. | |
| 6,549,409 B1 * | 4/2003 | Saxelby et al. | 361/704 |
| 6,665,182 B1 * | 12/2003 | Hogerl | 361/695 |

FOREIGN PATENT DOCUMENTS

| | | |
|---|---|---|
| EP | 0951207 A1 | 10/1999 |
| EP | 1041002 A2 | 10/2000 |

* cited by examiner

*Primary Examiner*—Boris Chervinsky
(74) *Attorney, Agent, or Firm*—Bacon & Thomas PLLC

(57) ABSTRACT

A retaining and heat dissipating structure for electronic equipments installed aboard space, air or land vehicles comprises a ceramic powder (7), possibly mixed with a lightening material (8), placed with a certain degree of compression inside a container housing the printed circuit boards (1) carrying the equipment components (2).

22 Claims, 5 Drawing Sheets

RETAINING AND HEAT DISSIPATING STRUCTURE FOR ELECTRONIC EQUIPMENT

The present invention relates to a retaining and heat dissipating structure for electronic equipment, in particular electronic equipment installed aboard space, air or land vehicles.

Reduced mass, low amplification factors of mechanical stresses in the presence of high acceleration, and high heat dissipation are features of paramount importance especially in the space field, and the invention will be disclosed hereinafter with reference to such application. Yet, the invention can be used also in air or land applications, whenever the above requirements occur.

The inside of space vehicles, such as for instance telecommunication satellites, is generally occupied by a multiplicity of containers or boxes forming the external envelopes of electronic devices required for vehicle operation (subsystem load) or for performing the functions the vehicle has been designed for (payload). Generally, the devices internally consist of a number of analogue or digital printed circuit boards, which are mutually adjacent and carry the electronic components, possibly connected to a motherboard. The devices are generally mutually connected through electrical connectors or wirings that come out from the containers and that are connected to the printed circuit boards inside the devices.

Each device has, inside the space vehicle, a pre-set fixed position, defined by a number of constraints such as the container size, heat dissipation, the centre of gravity, stiffness, immunity from electromagnetic interference.

Generally, electronic equipment mounted aboard the satellites is subjected to overheating problems: indeed, heat dissipation is not assisted by convection phenomena, since the forced air, through which heat would be conveyed at ground, is lacking. More particularly, in case of high power equipment, the high heat dissipation required is achieved by placing a highly thermally conductive, but electrically insulating polymerisable material inside the container and between the boards: such material allows increasing heat dissipation through heat-conducting paths provided by the material itself, in parallel with the conventional path from the board to the outside of the equipment through the guides in which the boards are mounted, and then up to the container walls.

The above solution has some drawbacks. First, it considerably adds to the electronic equipment mass, due to the use of thermally conductive powders in admixture with a polymerising silicone resin, which together have a density that only seldom is below 1 g/cm$^3$. Moreover, once the filler is hardened, it is no longer capable of absorbing mechanical vibrations. Further, the presence of the hardened material makes replacement of equipment parts in case of failure very difficult or even impossible.

Conventional solutions in which dissipation is designed for normal, and not exceptional, heating conditions, provide for heat dissipation only through the guides rigidly secured to the container walls. In that case, first the boards internally contain a number of thin copper layers to make the boards more conductive. Moreover, the boards are associated with strengthening frames, which increase the board stiffness and increase the natural vibration frequency of the equipment. Yet, those solutions entail high engineering costs to keep stress amplification within the admitted limits and to obtain acceptable heat conductivity.

To reduce load factors on the electronic boards, the use has been proposed of small silicone elements, pre-compressed between the boards, to dampen dynamic amplification of the accelerations, which may reach levels up to 20–60 times the input acceleration level.

Yet, also that solution considerably adds to the equipment mass and it does not result into an improvement of heat dissipation.

EP 1 041 002 A discloses a retaining and heat dissipating structure using elements of polymeric material that bear a coating of metal or metal fibres (metal wool) and are placed between the printed circuit boards inside a container for an electronic device and, if necessary, between the container and the external walls of a plurality of other devices contained therein. Being the metal layer or the metal wool electrically conductive, the boards are to be treated to maintain electrical insulation and, in case of the metal wool, to prevent abrasion. Thus, additional costs exist and moreover that solution has the drawback that it excessively increases the weight of the transported material.

EP 0 951 207 A discloses a retaining and heat dissipating structure using a lightweight loose material, with shock-absorbing properties, and a pressurised antifreeze and heat conducting liquid, arranged within a container housing elements forming the equipment. The system can be used for equipment in which said elements (generally, closed casings containing a plurality of boards) are suspended in the container so as to have a certain freedom of movement. Moreover, the above solution has the drawback of requiring a tightly sealed container to prevent liquid leakage, with a consequent cost increase.

The invention concerns a retaining and heat dissipating structure, which does not have the drawbacks of the prior art.

More particularly, a first object of the invention is to provide a retaining and heat dissipating structure in which the thermo-mechanical performance of the system vehicle—on board equipment is enhanced, thereby reducing the design effort, and hence the development costs, required to meet the specifications concerning load resistance and heat dissipation.

Another object of the invention is to provide a retaining and heat dissipating structure allowing decoupling, from the mechanical standpoint, the elements forming the equipment (printed circuit boards and/or housing containers) from higher level structures: thus, the mass is reduced thanks to the elimination of mechanical connecting parts and, moreover, the manufacture is made simpler and the flexibility in arranging the individual parts within the containers and aboard the vehicle is increased.

A further object of the invention is to provide a retaining and heat dissipating structure in which the mechanical load factors are reduced, whereby containers with thinner wall can be used, thus allowing a further mass reduction.

The above and other objects are achieved by the retaining and heat dissipating structure according to the invention, comprising at least a container housing elements forming the equipment and a filler for the container filling the space around such elements, wherein said filler comprises a ceramic powder in loose condition.

It is known that ceramic powders have excellent dielectric and heat conducting properties and are commonly used in electronics, together with binders such as epoxy or urethane resins, silicones and other polymers, to improve conductivity of electrical components and to reduce the thermal expansion thereof, while maintaining electrical insulation. As far as we know, nobody has considered using such powders alone as a material for mechanical restraint of heavy printed circuit boards, possibly connected with a motherboard, or of parts of equipment located within containers, when such parts undergo high accelerations. Indeed, it is common conviction that the slip properties of the powder are an insurmountable hindrance to achieving the objects.

The invention also provides an air, space or land vehicle carrying electronic equipment arranged within one or more containers, wherein such equipment is associated with a retaining and heat dissipating structure utilising a ceramic powder placed within the or each container, and between containers carried by a common closed casing.

The above and other objects of the invention will become more apparent from the following description of preferred embodiments thereof, with reference to the accompanying drawings, in which.

Figure 1:
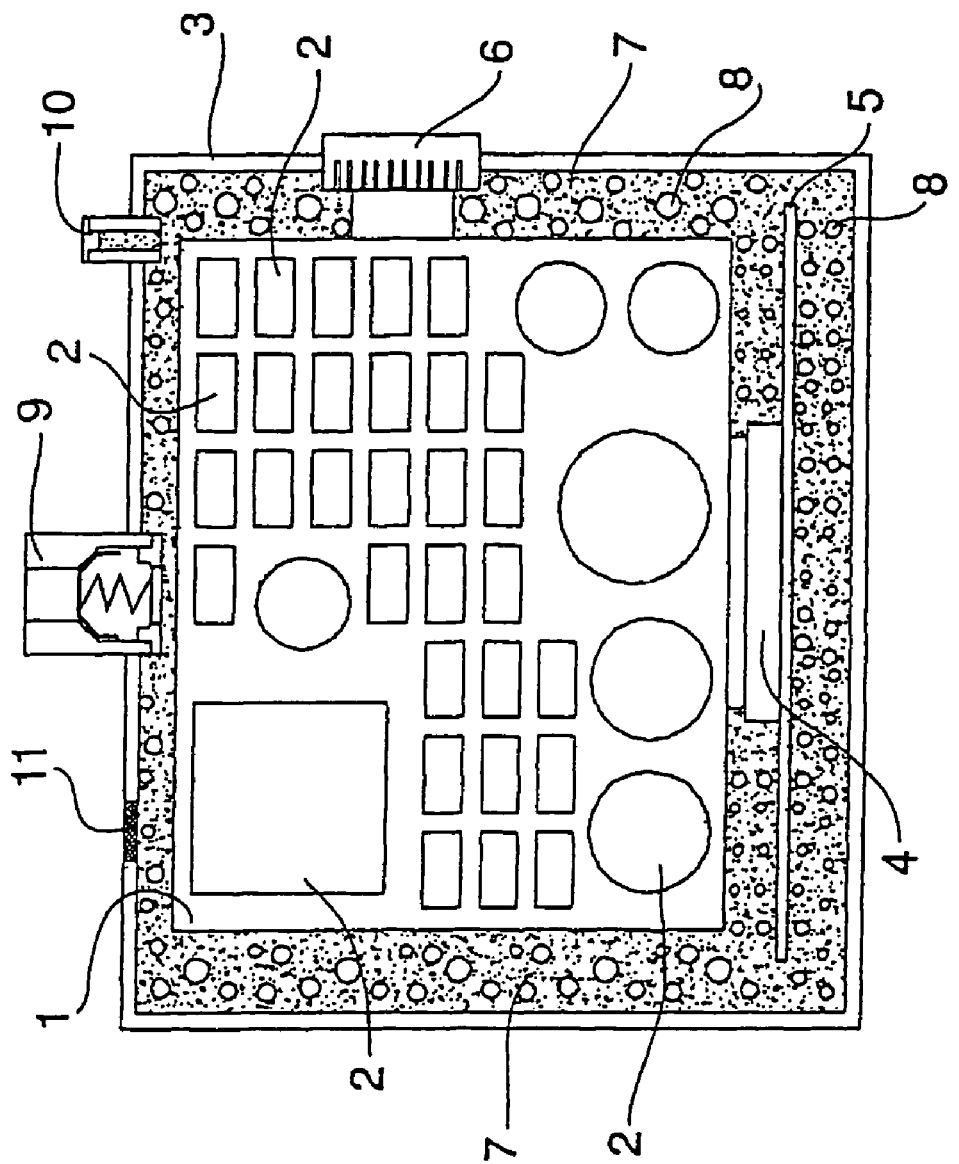
FIG. 1 is a front view of a device employing a retaining and heat dissipating structure according to the invention.
Figure 2:
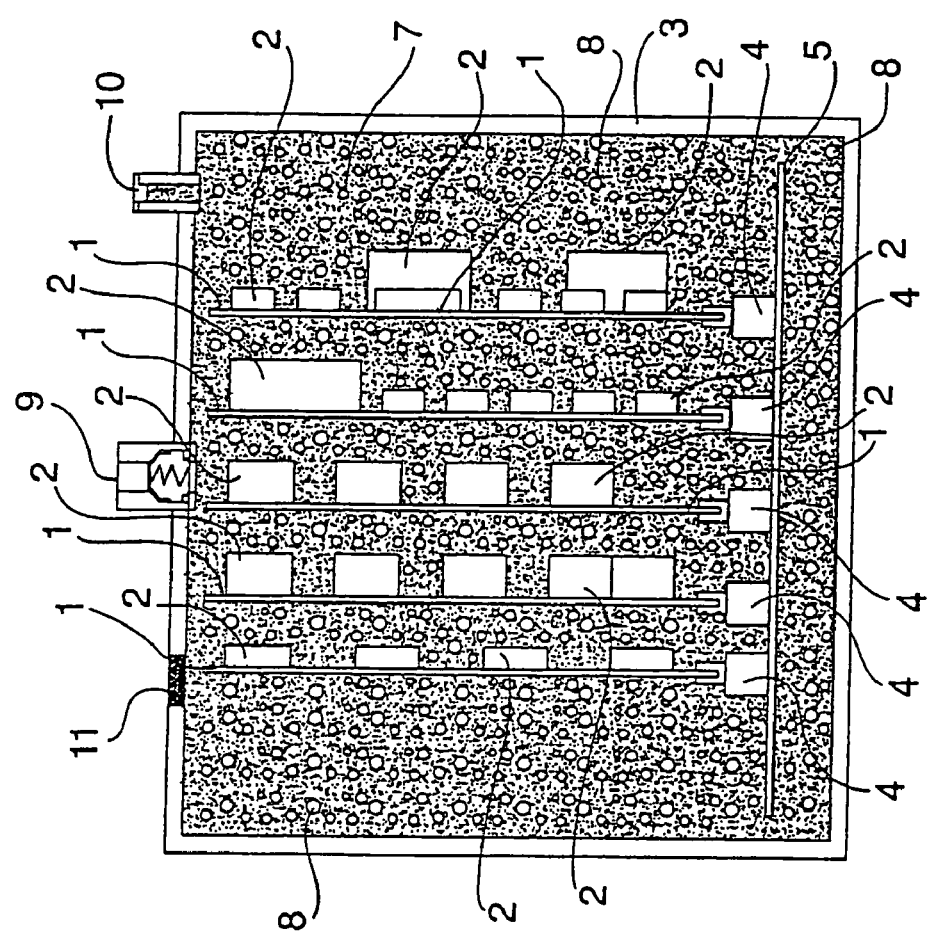
FIG. 2 is a side view of the device shown in FIG. 1.

Referring to FIGS. 1 and 2, an electronic equipment comprises a plurality of analogue and/or digital printed circuit boards 1 carrying a plurality of electronic components 2. The whole equipment is housed in a container or casing 3, suitable for being located aboard a satellite or other space, air or land vehicle. Depending on their functions, boards 1 can be connected to a motherboard 5 through connectors 4, as shown in the drawings, or they can be independent of one another. Other connectors 6, coming out from container 3, allow connecting the equipment to other equipment carried by the vehicle.

In this embodiment, boards 1 are not rigidly secured to container 3, but they are free, apart from the connection formed by motherboard 5, if any, and connector 6 fastened to the container wall. Motherboard 5 may be supported by suitable spacers 12, of rigid or elastomeric material, which keep the motherboard in a desired position and make insertion of boards connected thereto easier. The mechanical constraint consisting only of connectors 6 secured to the wall and of motherboard 5 more or less rigidly secured to container 3 would not be enough without intervention of another rigid mechanical support. The latter is obtained by introducing a ceramic powder 7 into container 3, into the gaps between boards 1 and motherboard 5, the powder being introduced in such an amount that it is submitted to a certain pressure that may be in the range from some millibars to about ten bars, e.g. 4 bar, in order not to impose an excessive weight penalty onto container 3.

Powder compression is the necessary and sufficient condition to create a mechanical stiffness for boards 1 and motherboard 5.

The size of the grains of ceramic powder 7 is preferably between about 0.1 µm and about 500 µm.

Ceramic powders suitable for the above purpose are for instance powders of: boron nitride (BN), aluminium nitride (AlN), aluminium oxide ($Al_2O_3$), beryllium oxide (BeO), silicon carbide (SiC), silicon nitride ($Si_3N_4$), titanium diboride ($TiB_2$), zirconium diboride ($ZrB_2$).

Ceramic powder 7, under the condition of use according to the invention, becomes a substantially uncompressible material that no longer can move under the action of the static and dynamic loads, which the equipment and its container undergo during vehicle movements. In effect, notwithstanding the reduced size, the grains, once compressed in a pre-set space, can move only if submitted to very high energies.

Ceramic powders have excellent dielectric and heat conducting properties and they do not cause abrasion of the electronic parts or of the wirings. Moreover the powders, being used alone and not together with resins to be polymerised to exert a mechanic restraint action, allow access to boards 1 for replacement in case of failure.

Use of a retaining structure of this kind allows significantly reducing the equipment mass, thanks to the elimination of guides and securing members and to the resulting possibility of making container 3 with thinner walls, taking into account that the container no longer needs to resist to stresses due, for instance, to the strong initial acceleration of the satellite or other vehicle.

By using ceramic powders as a filler, a retaining and heat dissipating structure is built allowing achieving the above objects.

The presence of the filler also increases protection against cosmic radiation.

Since it is more convenient, for the functional checks, that boards 1 and motherboard 5, if any, are placed into container 3 before introducing powder 7, flexible spacers (not shown) can be provided inside the container to prevent sudden displacements of the parts during manipulations to which container 3 with the equipment may be submitted.

If the filler density is to be kept below given limits, powder 7 can be mixed with a lighter material, consisting of hollow elements 8 (e.g. balls, cuboids and the like) of rigid or flexible polymeric material. It is to be appreciated that elements 8 have no load resistance tasks, but they only are to reduce the overall mass.

Powder 7 and lightening elements 8 may be introduced through a removable cover of container 3 or, as shown in the drawing, through a loading valve 9. A control valve 10 allows controlling filling operation and exhausting air.

For space applications, a filter or porous partition can be provided to let out residual air in a controlled time once the vehicle is in the empty space. Of course, the size of the partition pores will be smaller than the minimum size of the powder grains.

Further, it is possible to create a vacuum inside container 3 once the powder has been introduced and compressed. In such case a partition to let out air will not be necessary, but container 3 should be made as airtight as possible. The advantage of this solution is that the system is made even more rigid and that the walls of container 3 can be made very light, the overall container stiffness being ensured by the negative pressure differential with respect to the outside pressure.

Figure 5:
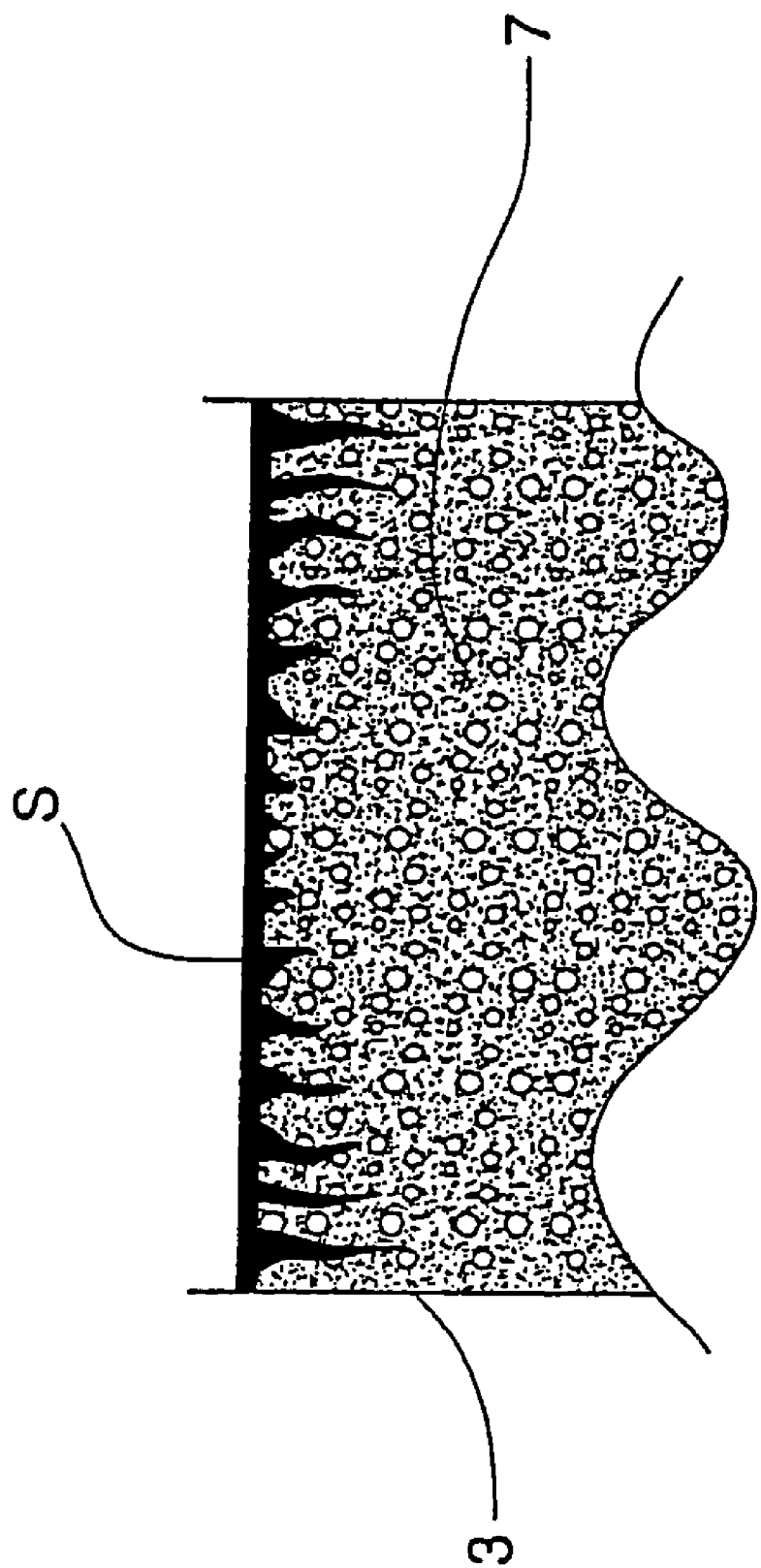
FIG. 5 is a schematical cross-sectional view of a variant embodiment of the invention.

According to a variant embodiment schematically shown in FIG. 5, the surface of the powder in loose condition contained within container 3, once the powder has been compressed, is coated with a suitable paint which, once dried, forms a layer S sealing container 3.

The paint actually penetrates into the space normally occupied by the air between the powder grains, forming a hard surface layer S or crust.

Suitable paints for that purpose are for instance paints in the group known as "conformal coating", which are used as insulating materials for electrical protection of electronic boards.

Such paints can advantageously be sprayed onto the surface of the powder in the container so as to obtain a layer S with a thickness of some millimeters, preferably about 10 mm, sealing the powder.

However, the paint deposited onto the mass of ceramic powder could also penetrate deeply so as to fill substantially the whole space between the powder grains in container 3.

Of course, in such a way closing container 3 with a cover could be dispensed with.

Figure 3:
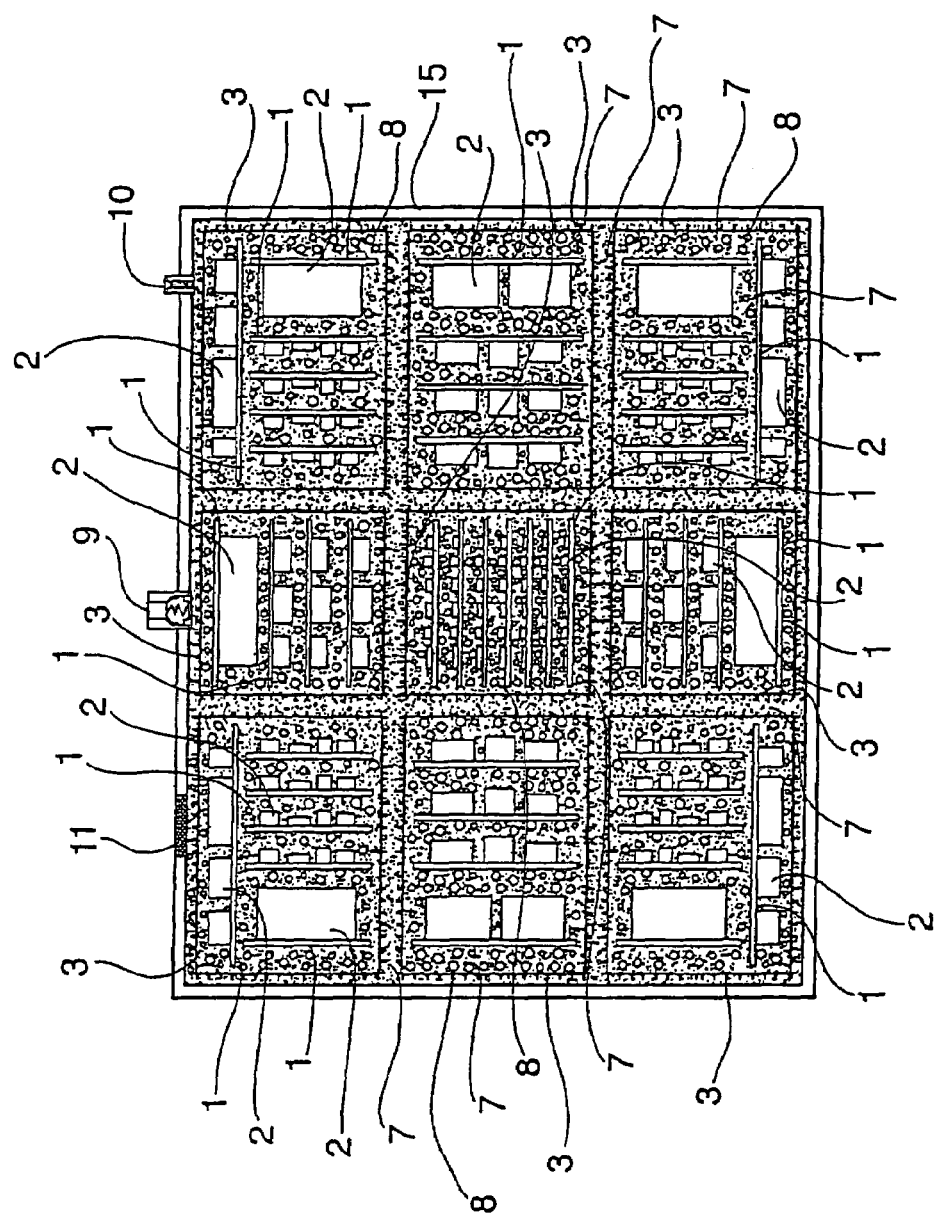
FIG. 3 is a side view of a set of devices like that shown in FIG. 1, wherein a retaining and heat dissipating structure according to the invention is used also between the individual devices.

FIG. 3 shows the application of the invention to a complex system comprising a plurality of devices like that shown in FIGS. 1 and 2. Elements already disclosed in FIGS. 1 and 2 are denoted by the same reference numerals. For sake of simplicity of the drawing, neither the connectors/wirings for connecting the different devices, nor the motherboards, if any, inside the devices are shown.

Each device, comprising the plurality of printed circuit boards 1 with electronic components 2, is therefore mounted in a respective container 3 filled with ceramic powder 7 possibly mixed with lightening material 8. Containers 3 are located inside a box or common closed casing 15 and are mechanically decoupled therefrom. The space between containers 3 and the internal walls of box 15 is then wholly filled with the compressed ceramic powder, with the possible addition of lightening material 8.

In the Figure, introduction and control valves 9, 10 and porous partition 11 are shown for outer box 15 only.

Under the conditions illustrated, ceramic powder 7 forms the only means for mechanical restraint and heat dissipation for the whole structure and its parts. The advantages in terms of thermo-mechanical performance, described above with reference to a single device, are thus achieved also in case of a complex equipment.

Figure 4:
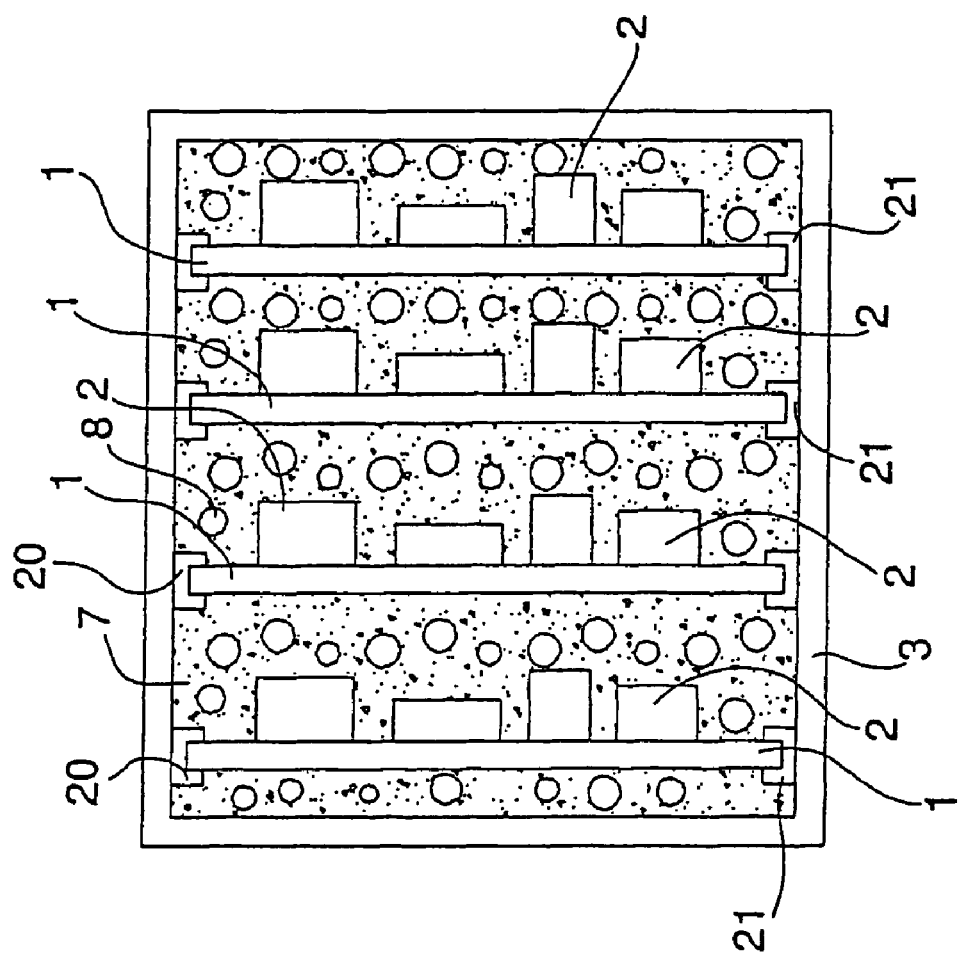
FIG. 4 is a view similar to FIG. 2, relevant to a different mounting of the printed circuit boards.

FIG. 4 shows the use of the present invention in a traditional equipment with a conventional mechanical structure, in which boards 1 are rigidly mounted, through securing means, not shown, in guides 20, 21 secured to the upper and lower walls of container 3. The space between boards 1 is still filled with ceramic powder 7, possibly mixed with lightening material 8. For sake of simplicity of the drawing, the motherboard, if any, the connectors, valves 9 and 10 and partition 11 are not shown.

In this case, the filler has a secondary mechanical function in reducing amplification, the primary function being performed by container 3 and guides 20, 21, as well as a primary function in improving heat dissipation of the equipment. The improvement is of course paid for with some increase in the equipment mass.

However, the solution shown in FIG. 4 may also be used to create a redundancy in the thermo-mechanical characteristics (restraint and dissipation) of a conventional equipment (thus equipped with heat dissipating elements associated with container 3 and distinct from ceramic powder 7). In case of a failure, with consequent development of a high thermal power, the equipment can continue operating, even though with reduced performance, thanks to the action of ceramic powder 7. Such a solution is of interest when the mass is not a particularly critical factor, whereas ensuring a high operation reliability is essential.

Of course, also the solution shown in FIG. 4 can be extended to complex structures, in which containers 3 of the individual devices are secured to a box like box 15 in FIG. 3, possibly equipped with heat dissipating means distinct from the ceramic powder.

It is clear that the above description has been given only by way of non-limiting example and that changes and modifications are possible without departing from the scope of the invention.

The invention claimed is:

1. A retaining and heat dissipating structure for electronic equipment, comprising at least one container housing elements constituting the equipment and a filler filling the container and placed around said elements, wherein said filler comprises a ceramic powder in loose condition, said powder being compressed so as to create a mechanical stiffness for said elements.

2. A retaining and heat dissipating structure as claimed in claim 1 wherein said ceramic powder comprises grains having a size in the range about 0.1 μm to about 500 μm.

3. A retaining and heat dissipating structure as claimed in claim 1, wherein said ceramic powder is selected from the group consisting of boron nitride (BN), aluminium nitride (AlN), aluminium oxide ($Al_2O_3$), beryllium oxide (BeO), silicone carbide (SiCO, silicon nitride ($Si_3N_4$), titanium diboride ($TiB_2$), and zirconium diboride ($ZrB_2$) and mixtures thereof.

4. A retaining and heat dissipating structure as claimed in claim 1, wherein said ceramic powder is mixed with a lightening material having a specific weight lower than that of the ceramic powder.

5. A retaining and heat dissipating structure as claimed in claim 4, wherein said lightening material comprises hollow elements of polymeric material.

6. A retaining and heat dissipating structure as claimed in claim 1, wherein said elements forming the equipment are mechanically decoupled from said container, and said ceramic powder is the only mechanically retaining and heat dissipating arrangement for said elements.

7. A retaining and heat dissipating structure as claimed in claim 1, wherein said elements constituting the equipment are mechanically coupled to said containers, and said ceramic powder is only a heat dissipating arrangement for said elements.

8. A retaining and heat dissipating structure as claimed in claim 1, wherein said elements constituting the equipment are mechanically coupled to said container, and said ceramic powder is a redundant element for either or both mechanical restraint and heat dissipation, to thereby ensure the equipment operation even in case of a failure inside said container.

9. A retaining and heat dissipating structure as claimed in claim 1, comprising a plurality of said containers placed inside a common enclosure, and wherein said ceramic powder, is optionally mixed with said lightening material, is placed also inside enclosure, around said containers.

10. A retaining and heat dissipating structure as claimed in claim 9, wherein said ceramic powder placed around said containers is compressed in said casing.

11. A retaining and heat dissipating structure as claimed in claim 1, wherein said ceramic powder is compressed to a pressure in the range 1 mbar to 10 bar, preferably 4 bar.

12. A retaining and heat dissipating structure as claimed in claim 9, wherein said containers are mechanically decoupled from said enclosure, and said ceramic powder placed in and around said containers is the only mechanically retaining and heat dissipating means for the electronic equipment.

13. A retaining and heat dissipating structure as claimed in claim 9, wherein said containers are mechanically coupled to said enclosure, and said ceramic powder placed around said containers is only a heat dissipating means for the electronic equipment.

14. A retaining and heat dissipating structure as claimed in claim 9, wherein said containers are mechanically coupled to said enclosure, and said ceramic powder placed around said containers is a redundant element for either or both mechanical restraint and heat dissipation, to thereby ensure the equipment operation even in case of a failure inside the enclosure.

15. A retaining and heat dissipating structure as claimed in claim 1, wherein either or both said container and said enclosure are associated with a valve for introducing the filler.

16. A retaining and heat dissipating structure as claimed in claim 9, wherein either or both said container and said enclosure are associated with a valve for controlling the filling of either or both the container and of the enclosure and for exhausting air remaining trapped within the filler.

17. A retaining and heat dissipating structure as claimed in claim 9, wherein the mass of the ceramic powder in loose condition is covered with a paint that, once dried, forms a "crust" (S) in either or both said container and said enclosure.

18. A retaining and heat dissipating structure as claimed in claim 17, wherein said layer or "crust" (S) has a thickness of about 10 mm.

19. A retaining and heat dissipating structure as claimed in claim 17, wherein said paint is a paint selected from the group of paints known as "conformal coating", which are used as insulating material for electrical protection of electronic boards.

20. A retaining and heat dissipating structure as claimed in claim 9, wherein either or both said container and said enclosure are carried aboard a vehicle intended to operate in an environment where vacuum exists, and are associated with a porous partition for controlled exhaust of residual air molecules.

21. A retaining and heat dissipating structure as claimed in claim 9, wherein either or both said container and said enclosure are airtight, and a vacuum is created inside either or both said container and said enclosure.

22. A space, air or land vehicle carrying electronic equipment located inside at least one container, wherein said container includes a retaining and heat dissipating structure for said equipment as claimed in claim 1.

* * * * *

UNITED STATES PATENT AND TRADEMARK OFFICE
CERTIFICATE OF CORRECTION

PATENT NO. : 7,099,157 B2
APPLICATION NO. : 10/512854
DATED : August 29, 2006
INVENTOR(S) : Fabrizio Boer It is certified that error appears in the above-identified patent and that said Letters Patent is hereby corrected as shown below:

Title page, item [73], should read --Assignees: Arthe Engineering Solutions S.R.L. (IT); Laben S.P.A.. (IT)--.

Signed and Sealed this

Eleventh Day of September, 2007

JON W. DUDAS
*Director of the United States Patent and Trademark Office*